United States Patent
Ding (10) Patent No.: US 10,965,249 B2
(45) Date of Patent: Mar. 30, 2021

(54) CRYSTAL OSCILLATOR CIRCUIT AND METHOD FOR STARTING UP A CRYSTAL OSCILLATOR

(71) Applicant: Stichting IMEC Nederland, Eindhoven (NL)

(72) Inventor: Ming Ding, Eindhoven (NL)

(73) Assignee: IMEC vzw, Leuven (BE)

(*) Notice: Subject to any disclaimer, the term of this patent is extended or adjusted under 35 U.S.C. 154(b) by 63 days.

(21) Appl. No.: 15/952,848

(22) Filed: Apr. 13, 2018

(65) Prior Publication Data
US 2018/0302034 A1 Oct. 18, 2018

(30) Foreign Application Priority Data
Apr. 18, 2017 (EP) .................................... 17166879

(51) Int. Cl.
*H03B 5/30* (2006.01)
*H03B 5/36* (2006.01)
*H03B 5/06* (2006.01)
*G06F 1/10* (2006.01)
*H03B 5/04* (2006.01)

(52) U.S. Cl.
CPC ............... *H03B 5/36* (2013.01); *G06F 1/10* (2013.01); *H03B 5/04* (2013.01); *H03B 5/06* (2013.01); *H03B 5/362* (2013.01); *H03B 5/364* (2013.01); *H03B 5/366* (2013.01); *H03B 2200/0082* (2013.01); *H03B 2200/0094* (2013.01)

(58) Field of Classification Search
CPC .......... H03B 5/36; H03B 5/362; H03B 5/366; H03B 5/364; H03B 5/06; H03B 5/04; H03B 2200/0094; H03B 2200/0082; G06F 1/10

USPC ................................ 331/116 R, 116 FE, 158
See application file for complete search history.

(56) References Cited

U.S. PATENT DOCUMENTS

| 4,763,021 A | * | 8/1988 | Stickel | ............. H03K 19/00384 326/32 |
| 5,844,448 A | * | 12/1998 | Jackoski | ................ H03K 3/014 331/158 |
| 7,138,881 B2 | | 11/2006 | Lin | |
| 7,348,861 B1 | * | 3/2008 | Wu | ......................... H03B 5/366 331/158 |

(Continued)

FOREIGN PATENT DOCUMENTS

| EP | 1587211 A1 | 10/2005 |
| WO | 2016/146154 A1 | 9/2016 |

OTHER PUBLICATIONS

European Search Report, European Patent Application No. 17166879.1, dated Jan. 24, 2018, 11 pages.

*Primary Examiner* — Richard Tan
(74) *Attorney, Agent, or Firm* — McDonnell Boehnen Hulbert & Berghoff LLP (57) ABSTRACT

A crystal oscillator circuit comprises: a crystal oscillator; and an injection frequency generating circuit, the injection frequency generating circuit being configured to sense a signal of the crystal oscillator and amplify the sensed signal, the injection frequency generating circuit being further configured to inject the amplified signal to the crystal oscillator; wherein the crystal oscillator circuit is configured such that the crystal oscillator receives the amplified signal during an initial start-up period of the crystal oscillator and stops receiving the amplified signal at an end of the initial start-up period.

17 Claims, 7 Drawing Sheets

(56) References Cited

U.S. PATENT DOCUMENTS

| | | | |
|---|---|---|---|
| 7,599,140 B2* | 10/2009 | Tsuyama | H03K 5/26 |
| | | | 360/51 |
| 9,246,435 B1 | 1/2016 | Kavousian et al. | |
| 2008/0105054 A1 | 5/2008 | Kanai et al. | |
| 2009/0084180 A1* | 4/2009 | Yoshida | G01F 1/8422 |
| | | | 73/504.02 |
| 2011/0001570 A1* | 1/2011 | Niwa | H03B 5/36 |
| | | | 331/108 R |
| 2011/0037527 A1 | 2/2011 | Shrivastava et al. | |
| 2011/0121907 A1* | 5/2011 | Kanai | G01C 19/56 |
| | | | 331/65 |
| 2013/0257548 A1 | 10/2013 | Li et al. | |
| 2015/0214894 A1* | 7/2015 | Calhoun | H03B 5/364 |
| | | | 331/115 |
| 2015/0333694 A1 | 11/2015 | Griffith et al. | |
| 2016/0099677 A1 | 4/2016 | Abbasi et al. | |

* cited by examiner

CRYSTAL OSCILLATOR CIRCUIT AND METHOD FOR STARTING UP A CRYSTAL OSCILLATOR

CROSS-REFERENCE TO RELATED APPLICATIONS

The present application is a non-provisional patent application claiming priority to European Patent Application No. 17166879.1, filed Apr. 18, 2017, the contents of which are hereby incorporated by reference.

FIELD OF THE DISCLOSURE

The present inventive concept relates to a crystal oscillator circuit and in particular to start-up of a crystal oscillator.

BACKGROUND

Crystal oscillators are widely used as a reference clock or a real time counter in various applications. Crystal oscillators may be used in portable or small-sized devices, where power is limited and, hence, power consumption of the device is a concern.

A crystal oscillator having a high quality (Q) factor may take a long time to start up after receiving power. It follows that power consumption of the device is affected by the start-up time.

The start-up time of the crystal oscillator may be especially important for small wireless devices in wireless networks. A wireless sensor node may be configured to be mainly in a sleep mode and only power up when a data packet is to be transmitted on the wireless network. The start-up time of the crystal oscillator may be in the same order of magnitude (milliseconds) or even longer than the time during which the device is active for transmitting a data packet.

Hence, reduction of start-up time of the crystal oscillator would significantly affect power consumption of wireless sensor nodes.

Frequency injection, i.e., providing an external frequency to activate the crystal oscillator, may reduce the start-up time of the crystal oscillator significantly. However, the frequency of an injection signal needs to be very close to the crystal oscillator frequency in order for the frequency injection to reduce the start-up time. In particular, the frequency of the crystal oscillator and an injection frequency generator may not be affected in the same manner by environmental changes, as the frequency provided by the injection frequency generator may typically drift with environmental changes, such as a temperature. Thus, in some conditions, the injection frequency may not be sufficiently close to the frequency of the crystal oscillator for reducing the start-up time.

In US 2015/0333694, a circuit including a crystal oscillator to generate an output frequency for a circuit is disclosed. A driving oscillator generates a startup signal having a driving frequency that is provided to activate the crystal oscillator. The driving frequency of the startup signal is varied over a range of frequencies that encompass the operating frequency of the crystal oscillator to facilitate startup of the crystal oscillator. Although the driving oscillator generates a range of frequencies that encompasses the frequency of the crystal oscillator, the driving oscillator still needs to be calibrated and adapted to the crystal oscillator.

Thus, it would be desired to provide reduction of start-up time of a crystal oscillator which is easy to design and is robust to environmental changes.

SUMMARY

An objective of the present inventive concept is to provide a crystal oscillator circuit having a fast start-up time, which is insignificantly affected by external parameters, such as by environmental changes.

These and other objectives of the present inventive concept are at least partially met by the disclosure as defined in the independent claims. Example embodiments are set out in the dependent claims.

According to a first aspect, there is provided a crystal oscillator circuit comprising: a crystal oscillator; and an injection frequency generating circuit, the injection frequency generating circuit being configured to sense a signal of the crystal oscillator and amplify the sensed signal, the injection frequency generating circuit being further configured to inject the amplified signal to the crystal oscillator; wherein the crystal oscillator circuit is configured such that the crystal oscillator receives the amplified signal during an initial start-up period of the crystal oscillator and stops receiving the amplified signal at an end of the initial start-up period.

Thanks to the use of an amplifier-based frequency injection in the crystal oscillator circuit, the injection frequency generating circuit may provide a self-injection of a frequency that is same or similar to a frequency output by the crystal oscillator. Hence, the amplified signal being injected by the injection frequency generating circuit is correlated with the signal from the crystal oscillator itself. This implies that the injection frequency generating circuit will be highly correlated to the crystal oscillator. In addition, thanks to the amplifier-based injection frequency generating circuit, the latency of the injected frequency is constant against environmental variations. This implies that an effect of using the injection frequency generating circuit will be minimally affected by any environmental changes, such as process, voltage, and temperature (PVT) variations. Thus, the crystal oscillator circuit provides a robust start-up scheme for the crystal oscillator.

The injection frequency generating circuit receives a low power signal from the crystal oscillator. By amplifying this signal and injecting the amplified signal back into the crystal oscillator, internal noise in the crystal oscillator may be increased and the start-up time of the crystal oscillator therefore reduced. Since feedback from the injection frequency generating circuit causes output of a stronger signal from the crystal oscillator, the amplified signal formed by the injection frequency generating circuit also quickly becomes stronger so as to quickly increase the internal noise of the crystal oscillator. Thus, the use of the injection frequency generating circuit may significantly reduce start-up time of the crystal oscillator.

The self-injection of the frequency of the crystal oscillator may initially improve the signal output by the crystal oscillator. However, once the start-up process has been given a boost by the self-injection, the injecting of the amplified signal to the crystal oscillator may be ceased. This may imply that the injection frequency generating circuit is disabled so as to not consume further power.

The initial start-up period, during which the amplified signal is provided to the crystal oscillator, need not necessarily coincide with an entire start-up time for the crystal oscillator to achieve full swing. Rather, the initial start-up period may end before or after the crystal oscillator achieves full swing. In order to reduce power consumption of the injection frequency generating circuit, the initial start-up period may end before the crystal oscillator achieves full swing.

The crystal oscillator may be configured in different ways in order for the crystal oscillator to stop receiving the amplified signal at the end of the initial start-up period. For instance, the injection frequency generating circuit may be disabled or inactivated, based on an internal or external signal, at the end of the initial start-up period. Alternatively or additionally, the crystal oscillator may be disconnected from the injection frequency generating circuit.

The term "crystal oscillator" as used herein, should be construed as the conventional meaning of the term. A crystal oscillator uses a piezoelectric resonator as its frequency-determining element. The frequency-determining component may be a crystalline solid, such as a wafer of quartz crystal or ceramic. Hence, it has been given the name "crystal oscillator." However, it should be understood that any oscillator device using a piezoelectric resonator, although not strictly a crystal, should be encompassed by the term "crystal oscillator" as used herein.

According to an embodiment, the crystal oscillator circuit further comprises an injection frequency control circuit for enabling the injection frequency generating circuit during the start-up period and disabling the injection frequency generating circuit at the end of the start-up period.

Thus, the crystal oscillator circuit may comprise an injection frequency control circuit which controls the injection frequency generating circuit. This makes the crystal oscillator circuit fully autonomous as the crystal oscillator circuit may itself control the start-up of the crystal oscillator.

The injection frequency control circuit may provide an internal signal to enable and disable the injection frequency generating circuit. The end of the initial start-up period may be set to a default value, which may possibly be set by tests during manufacture of the crystal oscillator circuit, such that the injection frequency control circuit will disable the injection frequency generating circuit after a time corresponding to the default value. The default value could also be updated in the injection frequency control circuit based on an external signal, if it is determined that the initial start-up period needs to be shorter or longer.

The injection frequency control circuit may receive a signal from the crystal oscillator and based on a quality or characteristic of this signal (e.g., a level of the output or a number of clock cycles), the injection frequency control circuit may disable the injection frequency generating circuit. The signal from the crystal oscillator may alternatively be received by a separate circuit which may check the signal and then trigger the injection frequency control circuit to disable the injection frequency generating circuit.

According to an embodiment, the injection frequency generating circuit comprises a two-stage operational amplifier circuit for sensing and amplifying the signal of the crystal oscillator. The two-stage operational amplifier circuit may provide a high gain in a first stage and a large swing in a second stage, so as to isolate gain and swing requirements of the operational amplifier. Further, the two-stage operational amplifier circuit may be robust against environmental changes or variations.

In a particular embodiment, the two-stage operational amplifier circuit has a gain bandwidth which is stable against external process, supply voltage or temperature variations. The latency of the operational amplifier depends on the gain bandwidth of the operational amplifier. By making the gain bandwidth of the operational amplifier stable against PVT variations, the injection frequency generating circuit may be robust against PVT variations.

According to an embodiment, the injection frequency generating circuit is connected to pins on opposite sides of the crystal oscillator for sensing the signal and for injecting the amplified signal. Thus, the injection frequency generating circuit may use the pins on opposite sides of the crystal oscillator both for sensing the signal output by the crystal oscillator and then for feeding back the amplified signal to the crystal oscillator.

According to an embodiment, the injection frequency generating circuit is configured to vary a frequency of the signal injected to the crystal oscillator based on an injection frequency window extending signal. The frequency of the signal injected to the crystal oscillator may not be perfectly fitted to the frequency of the crystal oscillator, e.g., because the sensed signal is very weak and/or because the injection frequency generating circuit does not perfectly follow the frequency of the sensed signal. By varying the frequency of the signal injected to the crystal oscillator, it is ensured that at least during some periods of the injected signal, the frequency of the signal is sufficiently close to the frequency of the crystal oscillator for accelerating start-up of the crystal oscillator. The injection frequency window extending signal may thus provide a varying input for adjusting the frequency of the injected signal.

According to an embodiment, the injection frequency window extending signal affects a parameter for varying latency of an operational amplifier of the injection frequency generating circuit. By varying the latency of an operational amplifier, the frequency of the injected signal may be varied. The parameter may be e.g., an input bias current of the injection frequency generating circuit, a dimension of transistors of operational amplifiers, or a load capacitance at an output of an operational amplifier.

According to another embodiment, the injection frequency window extending signal affects a delay generator of the injection frequency generating circuit for varying latency of the delay generator. Thus, the varying of a frequency of the injection frequency generating circuit may be provided by adding a delay generator after the amplification of the sensed signal. The delay generator could be e.g., a digital-to-time converter (DTC) or digitally-controlled delay line (DCDL), which may add a latency to the amplified signal based on digital control bits.

According to an embodiment, the crystal oscillator circuit further comprises at least one load capacitor bank, which is configured to provide a tunable capacitance, such that a small capacitance is provided during start-up of the crystal oscillator.

In addition to using an injection frequency for reducing start-up time of the crystal oscillator, the crystal oscillator circuit may use a tunable loading capacitance. The start-up time of a crystal oscillator is approximately inversely proportional to a square of a loading capacitance of the crystal oscillator circuit. Thus, by providing a small capacitance during start-up of the crystal oscillator, the start-up time of the crystal oscillator may be reduced.

According to an embodiment, the crystal oscillator circuit may further comprise a clock detecting circuit, which is configured to receive a clock signal from the crystal oscillator and determine whether a quality of the clock signal is sufficient for output from the crystal oscillator circuit. The clock detecting circuit may thus provide detection of the clock signal so that the crystal oscillator circuit may be fully autonomous in varying properties of the circuit during start-up and outputting a clock signal when the crystal oscillator achieves full swing.

The clock detecting circuit may comprise an envelope detector. The envelope detector may be configured to determine a signal strength of the signal from the crystal oscillator.

The clock detecting circuit may further comprise a comparator which may receive an envelope signal from the envelope detector. The comparator may be configured to determine whether an amplitude of the signal from the crystal oscillator exceeds a threshold level. Thus, the combination of an envelope detector and a comparator may determine the signal strength of the signal output by the crystal oscillator.

According to an embodiment, the clock detecting circuit is configured to output a ready signal to a loading capacitance control circuit when it is determined that a quality of the clock signal is sufficient for output from the crystal oscillator circuit, wherein the ready signal triggers increasing a capacitance of the at least one load capacitor bank of the crystal oscillator circuit. Thus, when the clock detecting circuit determines that the crystal oscillator has started up, the loading capacitance control circuit may receive a signal and thus control the tunable capacitance of the at least one load capacitor bank to be increased to its target value.

The loading capacitance control circuit and the injection frequency control circuit may be combined in a single circuit for controlling both the loading capacitance and the injection frequency. The injection frequency control circuit may thus also control the injection frequency generating circuit based on input from the clock detecting circuit. It should also be realized that the clock detecting circuit may be used in a crystal oscillator circuit which does not include a tunable capacitance. The clock detecting circuit may then merely provide input used by the injection frequency control circuit.

According to a second aspect, there is provided a wireless sensor node comprising the crystal oscillator circuit according to the first aspect, wherein the crystal oscillator circuit provides a reference clock signal or a real-time counter.

Effects and features of this second aspect are largely analogous to those described above in connection with the first aspect. Embodiments mentioned in relation to the first aspect are largely compatible with the second aspect.

The use of the crystal oscillator circuit of the first aspect, which provides a fast start-up time, may be beneficial in a wireless sensor node. The wireless sensor node may be configured to be active only for short periods of time, e.g., when sending a data packet on a wireless network. By having a short start-up time of the crystal oscillator, the period from powering up the wireless sensor node until the wireless sensor node may be set in a sleep mode again may be significantly shortened. Thus, power consumption of the wireless sensor node may be substantially decreased and hence battery life of the wireless sensor node may be increased.

According to a third aspect, there is provided a method for starting up a crystal oscillator, the method comprising: triggering start of oscillations by a crystal oscillator such that a signal is output by the crystal oscillator; sensing and amplifying the signal output by the crystal oscillator by an injection frequency generating circuit; and injecting the amplified signal to the crystal oscillator for increasing internal noise in the crystal oscillator to decrease start-up time of the crystal oscillator.

Effects and features of this third aspect are largely analogous to those described above in connection with the first and second aspects. Embodiments mentioned in relation to the first and second aspects are largely compatible with the third aspect.

The method provides a self-injection of the frequency of the crystal oscillator back into the crystal oscillator such that internal noise in the crystal oscillator is increased. This may substantially decrease start-up time of the crystal oscillator.

According to an embodiment, the method may further comprise disabling the injection frequency generating circuit at end of an initial start-up period of the crystal oscillator.

End of the initial start-up period may or may not coincide with the crystal oscillator achieving full swing. In an embodiment, the initial start-up period may end before the crystal oscillator has achieved full swing. Thus, the self-injection may act to boost early start-up of the crystal oscillator, but may then be disabled to reduce power consumption by the injection frequency generating circuit.

According to an embodiment, the method further comprises increasing a loading capacitance of a crystal oscillator circuit in response to detecting that a quality of a clock signal is sufficient for output from the crystal oscillator circuit.

Thus, the method may further include tuning a loading capacitance of the crystal oscillator circuit. Having a small loading capacitance during start-up may positively affect the start-up time and, hence, in order to have a short start-up time, the loading capacitance may initially be small. When a clock signal is sufficient for output from the crystal oscillator, the loading capacitance may be increased to a target value.

BRIEF DESCRIPTION OF THE FIGURES

The above, as well as additional, features will be better understood through the following illustrative and non-limiting detailed description of example embodiments, with reference to the appended drawings.

The above, as well as additional objects and features of the present inventive concept, will be better understood through the following illustrative and non-limiting detailed description, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
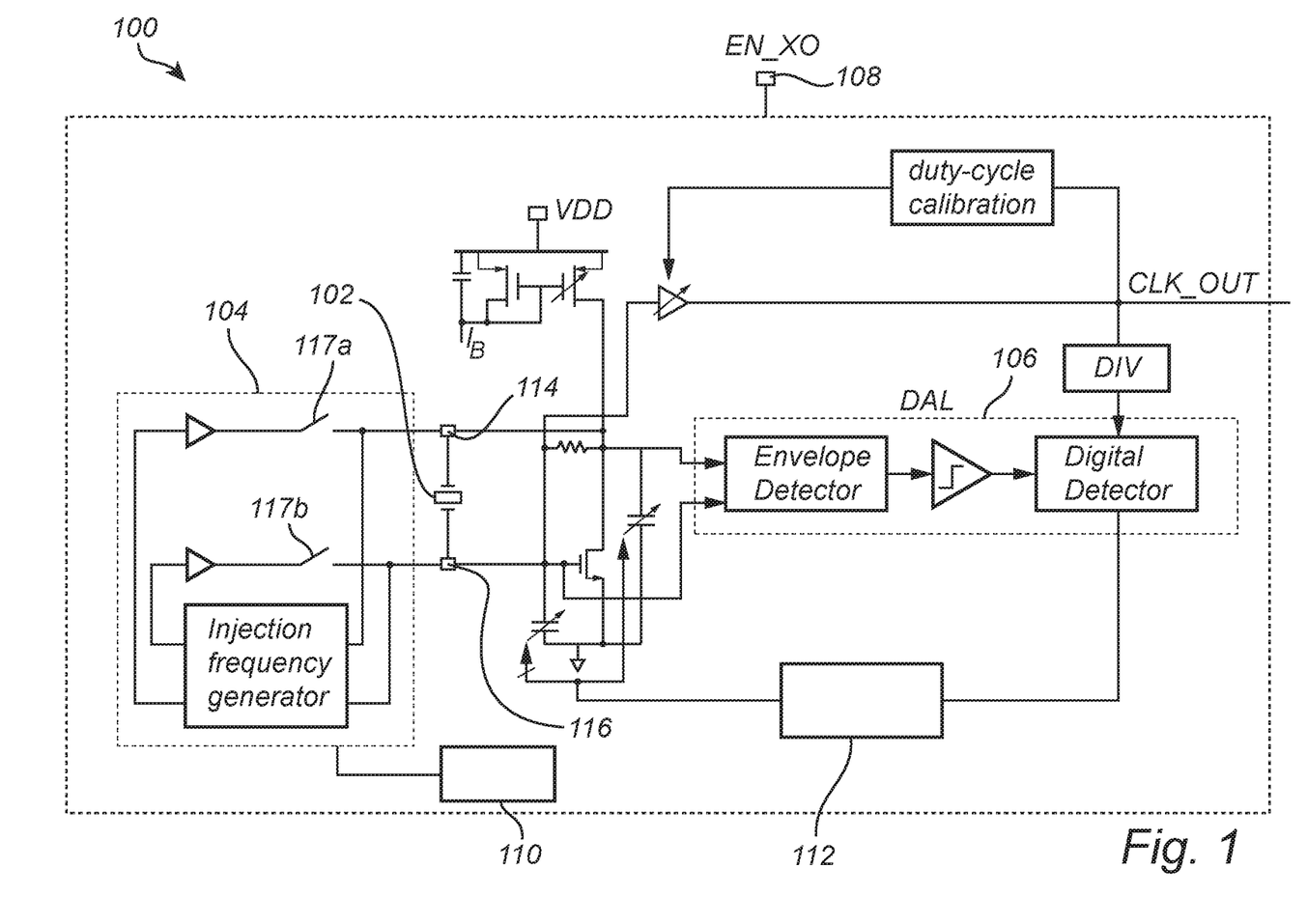
FIG. 1 is a schematic view of a crystal oscillator circuit, according to an example embodiment.

FIG. 1 is a schematic view of a crystal oscillator circuit 100 according to an embodiment. The crystal oscillator circuit 100 comprises a crystal oscillator 102, which may provide a clock signal with a well-defined frequency.

The crystal oscillator circuit 100 may be configured for providing a short start-up time of the crystal oscillator 100. The crystal oscillator circuit 100 may comprise an injection frequency generating circuit 104, which may be configured to, during an initial start-up period of the crystal oscillator 102, sense a signal of the crystal oscillator 102 and amplify the sensed signal so as to inject the amplified signal back to the crystal oscillator 102. Thus, an internal noise in the crystal oscillator 102 is increased and the start-up time may be reduced.

The crystal oscillator circuit 100 may also comprise a dynamically adjusted load circuit 106, which is configured to control a loading capacitance of the crystal oscillator circuit 100. The loading capacitance may thus be tuned such that a small loading capacitance may be provided during start-up so as to reduce the start-up time.

The crystal oscillator circuit 100 may comprise a single input pin 108 for receiving an enable signal to start up the crystal oscillator. The crystal oscillator circuit 100 may be fully autonomous to provide a fast start-up of the crystal oscillator 102 based on an enable signal received on the input pin 108.

It is worthwhile to note that the crystal oscillator circuit 100 described herein is compatible with implementation of digitally-controlled crystal oscillators (DCXOs).

Thus, the crystal oscillator circuit 100 may internally control the injection frequency generating circuit 104 to provide an injected amplified signal to the crystal oscillator 102 during an initial start-up period of the crystal oscillator 102. The crystal oscillator circuit 100 may comprise an injection frequency control circuit 110 for enabling the injection frequency generating circuit 104 during the initial start-up period and disabling the injection frequency generating circuit 104 at an end of the initial start-up period.

The injection frequency control circuit 110 may receive the signal from the crystal oscillator 102, such that the injection frequency control circuit 110 may determine progress of the start-up of the crystal oscillator 102 and decide when the amplified signal from the injection frequency generating circuit 104 is no longer needed. The injection frequency control circuit 110 may also or alternatively receive an external signal (e.g., from another circuit in the crystal oscillator circuit 100), which may indicate to the injection frequency control circuit 110 that it is time to disable the injection frequency generating circuit 104, e.g., based on detection of a quality of the crystal oscillator signal.

The injection frequency control circuit 110 may alternatively use information based on simulations or tests of the crystal oscillator circuit 100, indicating a suitable length of the initial start-up period. The injection frequency control circuit 110 may then be arranged to disable the injection frequency generating circuit 104 when a time indicated by the information of the injection frequency control circuit 110 has passed.

The crystal oscillator circuit 100 may further comprise a loading capacitance control circuit 112, which may be arranged to control a loading capacitance of the crystal oscillator circuit 100. The loading capacitance control circuit 112 may be arranged to trigger increase of a loading capacitance when it is determined that a clock signal of sufficient quality is output by the crystal oscillator 102.

The injection frequency control circuit 110 and the loading capacitance control circuit 112 may be arranged in a common unit, which may output separate control signals for disabling/enabling the injection frequency generating circuit 104 and for tuning a loading capacitance of the crystal oscillator circuit 100. A common control circuit may e.g., use input of the progress of start-up of the crystal oscillator 102 both for controlling the injection frequency generating circuit 104 and for tuning the loading capacitance.

However, as indicated in FIG. 1, the injection frequency control circuit 110 and the loading capacitance control circuit 112 may be separate units.

Figure 2:
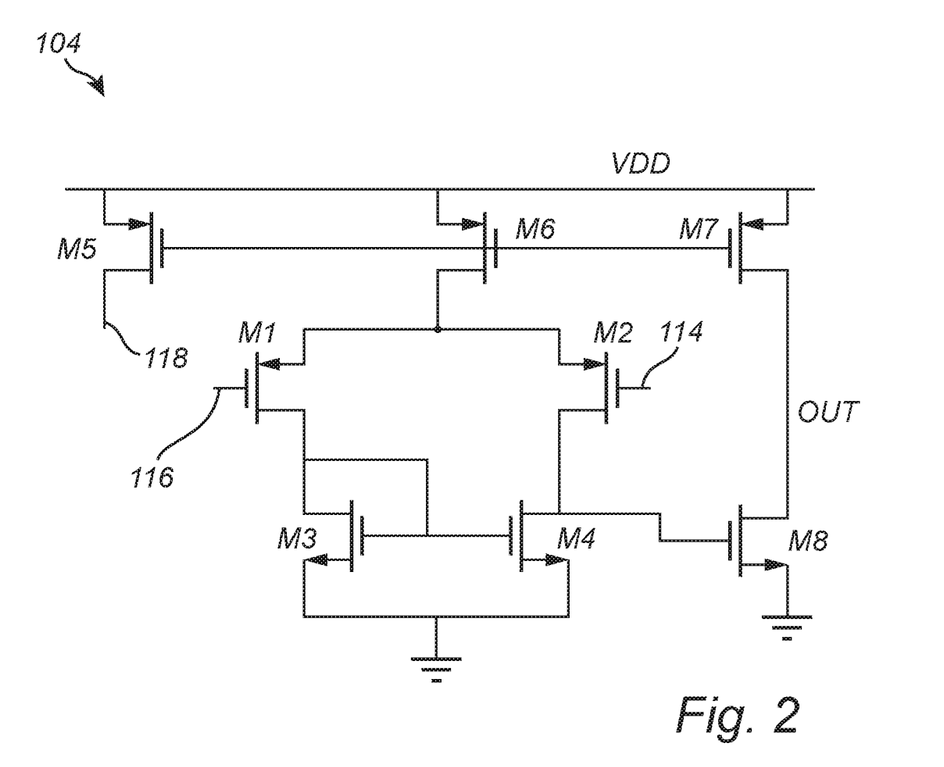
FIG. 2 is a schematic view of an injection frequency generating circuit of the crystal oscillator circuit, according to an example embodiment.

Referring now to FIG. 2, an embodiment of the injection frequency generating circuit 104 is further discussed. An amplifier, e.g., an operational amplifier, may be used to construct a feedback loop together with pins 114, 116 on opposite sides of the crystal oscillator 102. When switches 117a, 117b are closed (or the injection frequency generating circuit 104 is otherwise enabled), the components of the injection frequency generating circuit 104 generates an amplified oscillation signal. This amplified signal is injected into the crystal oscillator 102 via the pins 114, 116.

As shown in FIG. 2, the injection frequency generating circuit 104 may comprise a two-stage operational amplifier based amplifier and the generation of an injection signal may be based on the two-stage operational amplifier. The two-stage operational amplifier comprises inputs connected to the pins 114, 116 and an input 118 receiving an input bias current. The two-stage operational amplifier further comprises a number of transistors connected for forming the two-stage operational amplifier. The two-stage operational amplifier circuit may provide a high gain in a first stage and a large swing in a second stage, so as to isolate gain and swing requirements of the operational amplifier.

In comparison to an injection frequency being generated by an external RC-based oscillator, the two-stage operational amplifier is more robust against environmental changes, such as process, voltage, and temperature (PVT) variations.

The robustness of the operational amplifier may be explained as follows: the latency of an operational amplifier can be affected by $I_{op}/C_{op}$, where $I_{op}$ is a bias current of the operational amplifier and $C_{op}$ represents a capacitive load that the operational amplifier drives. Noting that the transconductance $g_m$ is proportional to $I_{op}$, the latency of the operational amplifier can also be approximated with $g_{m,op}/C_{op}$. Noting that $g_{m,op}/C_{op}$ is similar to a gain bandwidth (GBW) of the operational amplifier, the latency of the operational amplifier can be represented by the GBW of the operational amplifier. Therefore, to obtain a stable injection frequency, the latency of the operational amplifier needs to be stable, and therefore the GBW of the operational amplifier has to be stable. Noting that the capacitance $C_{op}$ is relatively stable against PVT variations, and that $g_m$ can usually be provided by a stable bandgap reference generator in operational amplifiers, the GBW of the operational amplifier can be relatively stable against PVT variations. Thus, the injection frequency generating circuit 104 based on a two-stage operational amplifier may be relatively robust against PVT variations.

Figure 3A:
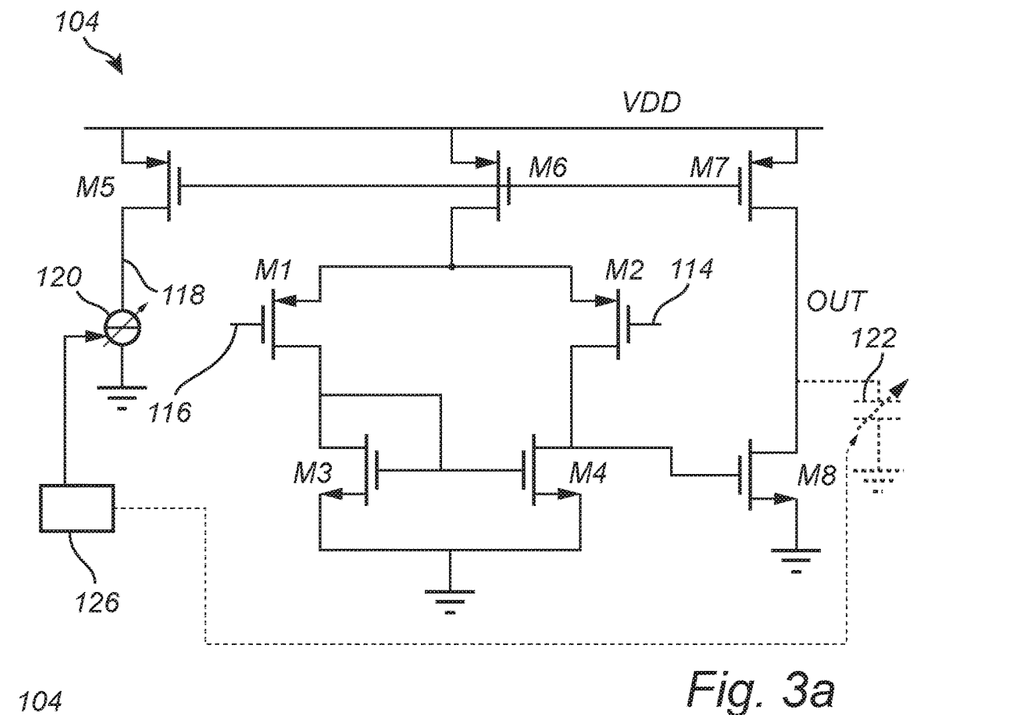
FIGS. 3a-b are schematic views illustrating injection frequency window extension in the injection frequency generating circuit, according to an example embodiment.
Figure 3B:
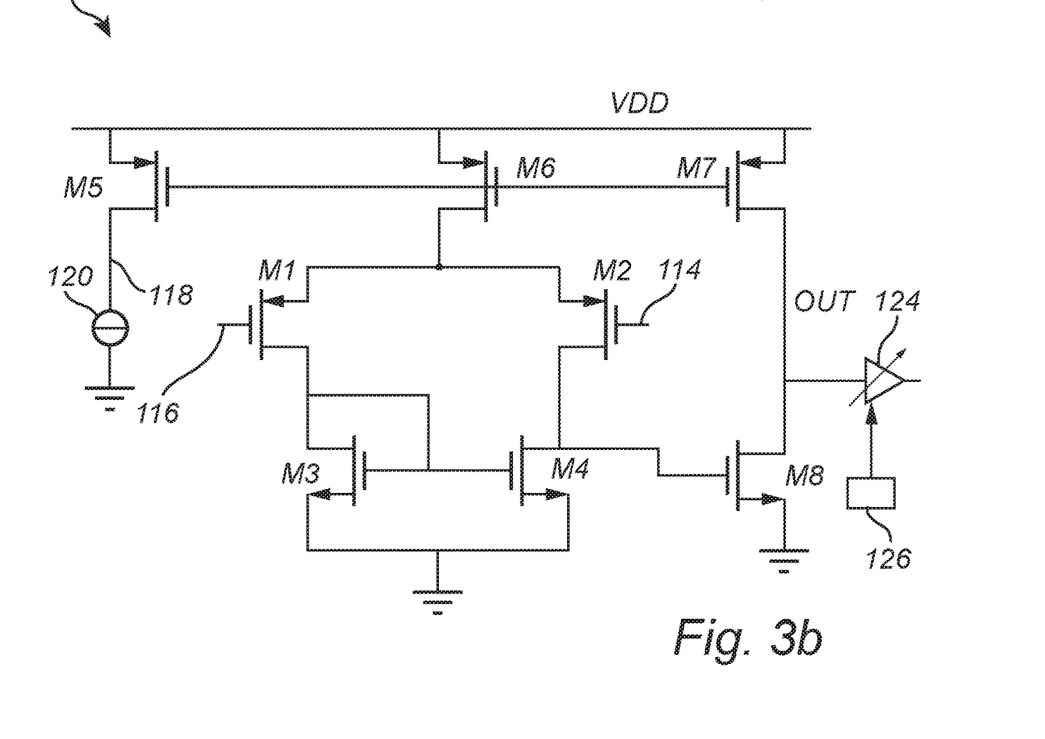

Referring now to FIGS. 3a-b, the injection frequency generating circuit 104 may be extended with a varying of a parameter of the injection frequency generating circuit 104, which can effectively increase a window size of the injection frequency. It is not necessary to use an increasing of the window size for frequency injection, but using an increased window size may make the injection frequency generating circuit 104 more robust in providing an injected frequency that corresponds to the frequency of the crystal oscillator 102.

In FIG. 3a, it is indicated that an input may be provided affecting a parameter for varying latency of the operational amplifier. As shown in FIG. 3a, there are some possible approaches for varying a parameter of the operational amplifier. For the operational amplifier, the transconductance or bias current can be varied by a current source 120, which may receive an input for providing a variable bias current. The current source 120 may provide a varying output for the input bias current of the operational amplifier e.g., through tuning a digital control bit. The varying of the input bias current may vary the latency of the operational amplifier such that the injection frequency generated by the injection frequency generating circuit 104 may be varied in a range around the frequency sensed by the operational amplifier and received from the crystal oscillator 102.

As further indicated in FIG. 3a, the latency of the operational amplifier can also be varied via varying of a load capacitance 122 at an output of the operational amplifier.

Also or alternatively, the latency of the operational amplifier may be varied by having multiple transistor elements in the injection frequency generating circuit 104 and, by switching which transistor element is active, a dimension of the transistors may be varied in order to vary the latency of the operational amplifier.

It should also be realized that a window size of the injection frequency may also or alternatively be varied by providing an external component to the operational amplifier for changing the frequency output by the operational amplifier. As shown in FIG. 3b, a delay generator 124 may be arranged at an output of the operational amplifier to add a varying delay to the output. Thus, a digital-to-time converter or digitally-controlled delay line may be arranged to provide a varying delay (or latency) based e.g., on digital control bits of the delay generator 124.

The varying of the injection frequency for providing an increased window size of the injection frequency may be based on an injection frequency window extending signal, which may be provided to a component for varying latency of the injection frequency generating circuit 104 as discussed above. The injection frequency window extending signal may be a varying signal and may, as mentioned above, be provided as digital control bits for controlling a component of the injection frequency generating circuit 104.

The injection frequency window extending signal may be provided by a control block 126. The control block 126 may be integrated in the injection frequency control circuit 110, but may alternatively be a separate control block.

The injection frequency window extending signal may be arranged to toggle or switch between at least two levels. However, the injection frequency window extending signal may be a varying code between multiple levels with a fixed pattern (e.g., ramp) or a random pattern. The control block 126 may suitably be a digital control block for digitally providing different codes as input for varying latency of the injection frequency generating circuit 104.

In addition to the injection frequency provided by the injection frequency generating circuit 104, the start-up time of the crystal oscillator 102 may also be reduced using a dynamically adjusted load circuit 106.

Figure 4:
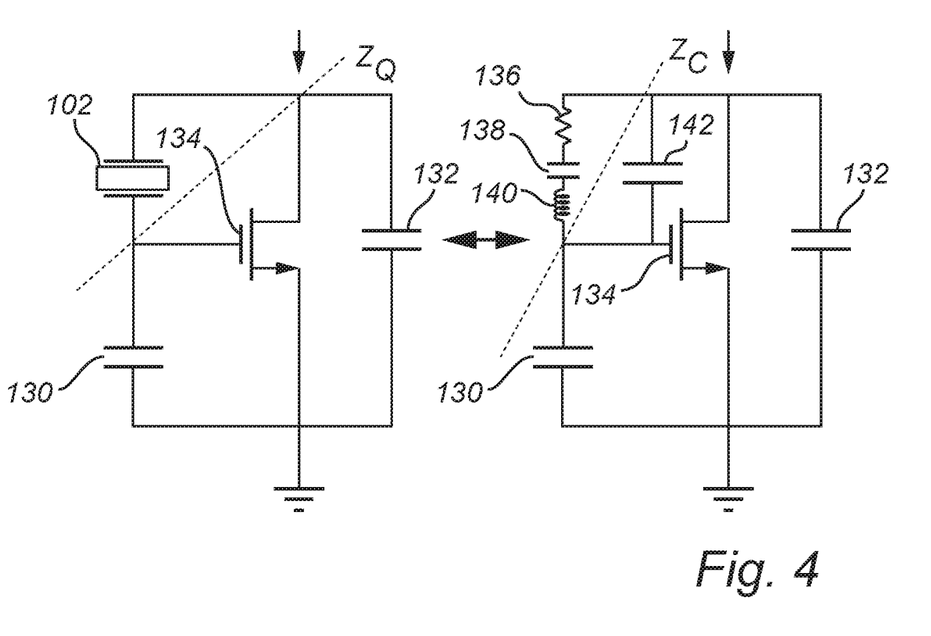
FIG. 4 is a schematic view illustrating impedance of a crystal oscillator circuit, according to an example embodiment.

To illustrate the principle of the dynamically adjusted load circuit 106, a part of a crystal oscillator circuit 100 is shown in FIG. 4. The crystal oscillator circuit 100 includes a crystal oscillator 102, two loading capacitors 130, 132 and an active circuit 134, here illustrated as a transistor. The crystal oscillator 102 may be represented by a resistor 136 having a resistance $R_m$, a capacitor 138 having a capacitance $C_m$ and an inductor 140 in series. Also, the capacitor 142 represents a parasitic capacitance of the crystal oscillator 102 itself. A total loading capacitance $C_L$ for equal capacitances $C_1$ and $C_2$ of the two loading capacitors 130, 132 becomes $C_1/2$. Further, a start-up condition of the crystal oscillator can be expressed as:

$$-Re(Z_c) >= R_s,$$

i.e., the real part of a negative resistance of the impedance $Z_c$ of the crystal oscillator circuit must be equal to or larger than a resistance $R_s$ of the resistor 136 of the crystal oscillator 102 in order to start-up and maintain oscillation.

The real part of $Z_c$ may be expressed as:

$$-Re(Z_c) = \frac{g_m C_1 C_2}{(g_m C_3)^2 + \omega^2 (C_1 C_2 + C_1 C_3 + C_2 C_3)^2} \approx \frac{g_m}{\omega^2 C_1 C_2} = -Re(Z_Q),$$

where $g_m$ is a transconductance of the crystal oscillator circuit, $C_1$ and $C_2$ are the capacitances of the loading capacitors 130, 132, respectively, $C_3$ is the parasitic capacitance of the capacitor 142 and $\omega$ is an oscillation angular frequency.

In order to reduce a start-up time of the crystal oscillator 102 while still maintaining minimum power overhead, reducing the loading capacitance $C_L$ is more attractive in comparison to increasing $g_m$ from two aspects. First, the negative resistance $R_N$ of the impedance $Z_c$ can be approximated to $-g_m/(2\omega C_L)^2$. It can be seen that $R_N$ is linearly proportional to $g_m$ but quadratic to $1/C_L$, so reducing $C_L$ is more effective to obtain higher $|R_N|$ at start-up. Second, the required minimum $g_m$ is proportional to $R_m(2\omega C_L)^2$, indicating that smaller $C_L$ gives a lower power requirement for start-up. Therefore, at start-up, smaller $C_L$ is desired for both fast start-up and low power consumption. However, at steady state, small $C_L$ results in a worse frequency pulling factor, proportional to $C_m/(C_3+2C_L)$ and makes a crystal oscillator frequency unstable and unpredictable against environmental variations.

Figure 5:
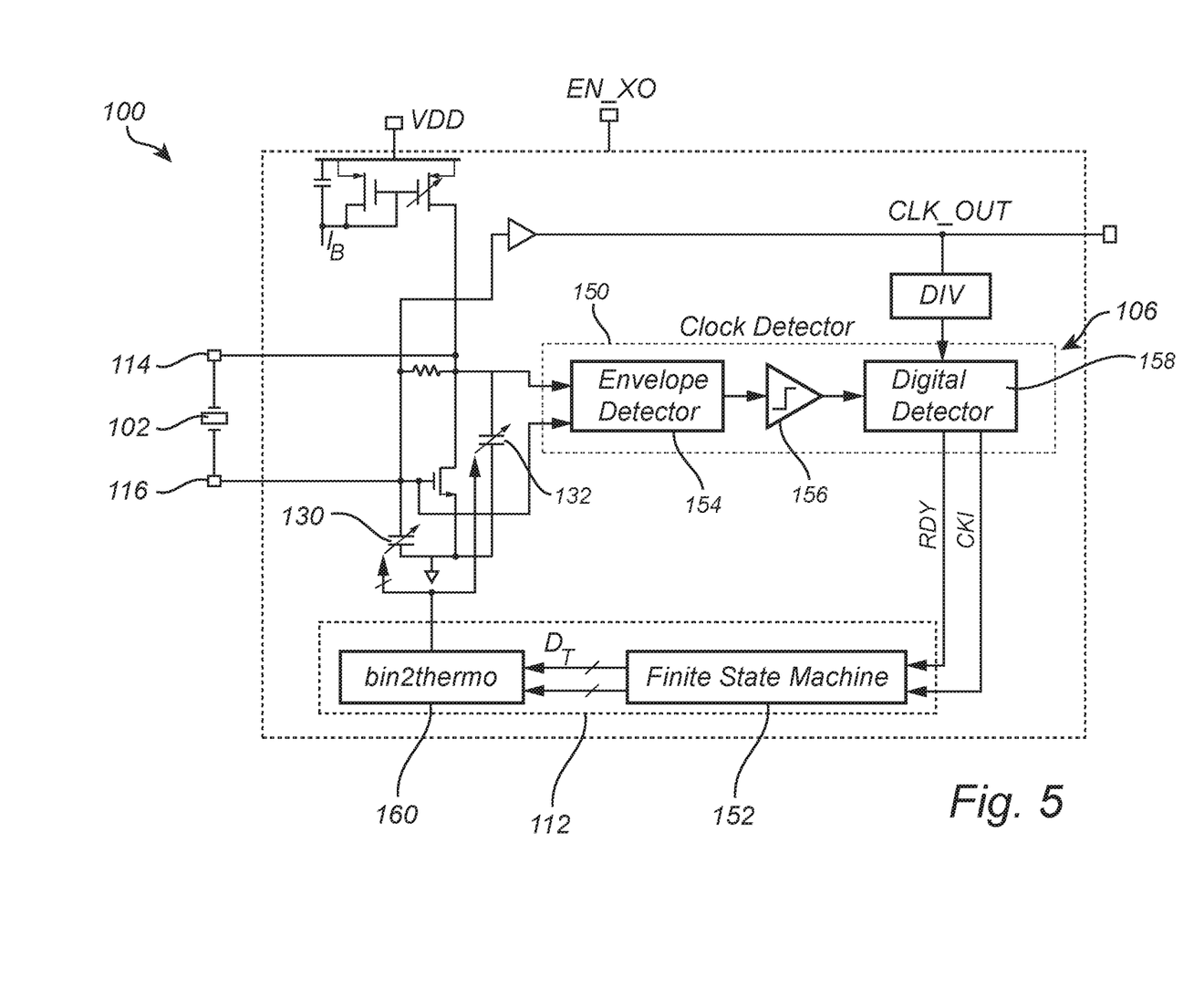
FIG. 5 is a schematic view of a dynamically adjustable load circuit of the crystal oscillator circuit, according to an example embodiment.

As illustrated in FIG. 5, a crystal oscillator circuit 100 may be arranged to provide a dynamically-adjusted load, minimizing the loading capacitance $C_L$ at first for fast start-up and thereafter incrementing $C_L$ for stable operations in the steady state. The dynamically-adjusted load technique is relatively insensitive to the value of $C_L$, which allows a larger $C_L$ to be employed to improve tolerance to parasitics changes.

Referring to FIG. 5, the dynamically adjusted load circuit 106 will now be explained in further detail. The dynamically adjusted load circuit 106 operates to reduce the capacitances of the loading capacitors 130, 132 to a minimum to facilitate fast start-up of the crystal oscillator 102, boosting the negative resistance $R_N$. Therefore, an amplitude of the crystal oscillator 102 is able to ramp up in a short time.

The dynamically adjusted load circuit 106 comprises a clock detector 150, which is configured to decide if the crystal oscillator 102 has a sufficient output swing to provide an output clock signal to control a digital circuit. If so, a loading capacitance control circuit 112 will automatically increase the loading capacitance of the loading capacitors 130, 132 to the targeted value.

The clock detector 150 may comprise an envelope detector 154 and a comparator 156. The envelope detector 154 together with the comparator 156 senses the amplitude of the signal output by the crystal oscillator 102. Additionally, the clock detector may comprise a digital clock detecting circuit 158, which receives an input from the comparator 156 and checks whether clock quality is sufficient for digital controlling. If the digital clock detecting circuit 158 finds that the clock quality is sufficient, the digital clock detecting circuit 158 outputs a ready signal to the loading capacitance control circuit 112.

The loading capacitance control circuit 112 may include a finite state machine (FSM) 152, which receives a clock signal from the digital clock detecting circuit 158 based on the clock signal output by the crystal oscillator 102. The clock signal may be received at a divided frequency based on the output by the crystal oscillator 102, which may imply a lower operation frequency and a better operation of the dynamically adjusted load feedback loop. The FSM 152 generates a tuning code for tuning a capacitance of the loading capacitors 130, 132. The tuning code may be provided to a block 160 for converting a binary code to a thermometer code. The thermometer code may then control the capacitance of the loading capacitors 130, 132.

The loading capacitors 130, 132 may be formed as loading capacitor banks. By further providing thermometer-encoded tuning input, any possible clock glitches due to a binary code may be avoided.

The crystal oscillator frequency deviates a few ppm away at the start-up due to frequency pulling and settles to the target frequency once the capacitances of the loading capacitors 130, 132 are set automatically to the target value. The whole start-up process is fully autonomous with only an enable signal.

The clock detector 150, which analyzes a quality of the output signal from the crystal oscillator 102 may also be used for providing input to the injection frequency control circuit 104. The clock detector 150 may thus output a trigger signal to the injection frequency control circuit 110 for triggering disabling of the injection frequency generating circuit 104. The trigger signal may be output in relation to another (lower) level of the signal output by the crystal oscillator than the level used for outputting the ready signal to the loading capacitance control circuit 112.

Figure 6:
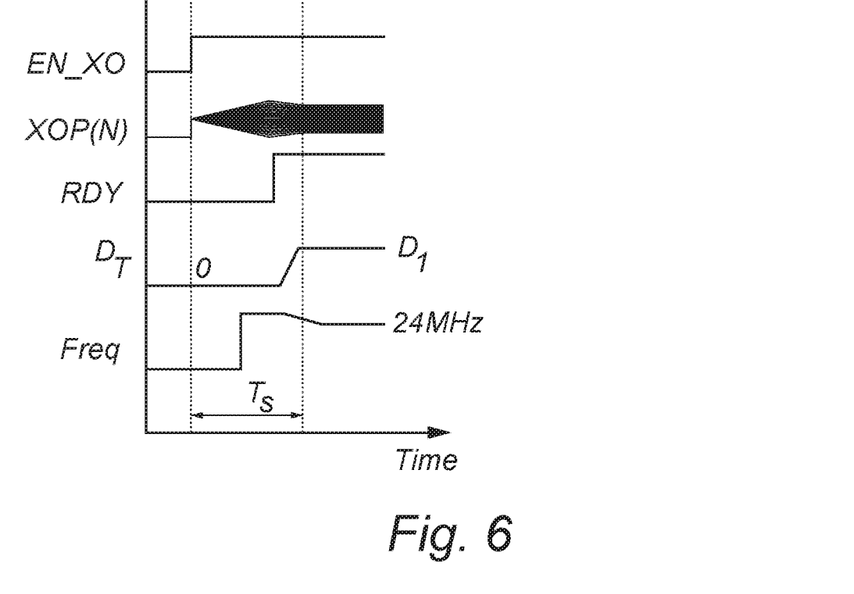
FIG. 6 is a diagram illustrating signals in time domain relating to the dynamically adjustable load circuit, according to an example embodiment.

FIG. 6 shows an illustration of a start-up behavior in time domain of the crystal oscillator circuit 100 using the dynamically adjustable load circuit 106. As indicated in FIG. 6, the start-up is initiated by an enable signal EN_XO. The signal XOP(N) on the pins 114, 116 shows that the clock signal has an increasing amplitude. When the amplitude is sufficiently large, the ready signal RDY goes high and is provided to the FSM 152. The FSM 152 generates the tuning code $D_T$, which gradually increases upon receipt of the ready signal to set the loading capacitors 130, 132 to a target value. As indicated by the line Freq, the frequency of the output clock signal will settle to the target value when the loading capacitance is increased.

Figure 7:
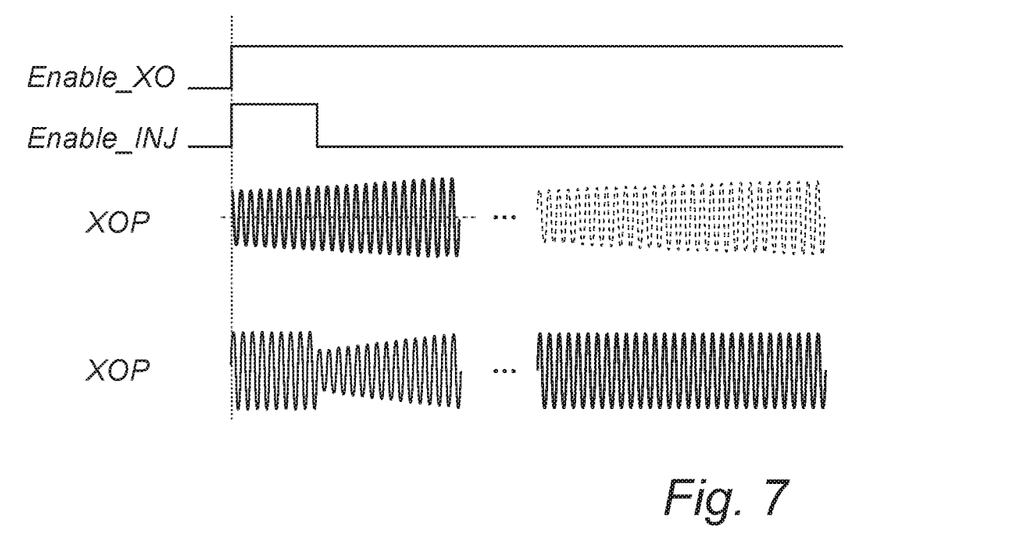
FIG. 7 is a diagram illustrating signals output by a crystal oscillator circuit, according to an embodiment, according to an example embodiment.

Referring now to FIG. 7, an effect of using the injection frequency generating circuit 104 and/or the dynamically adjustable load circuit 106 is schematically illustrated. As indicated in FIG. 7, when an enable signal EN_XO is received, the injection frequency generating circuit 104 may simultaneously be enabled by the signal EN_INJ from the injection frequency control circuit 110 to the injection frequency generating circuit 104.

In FIG. 7, different types of signals at the pin 114, 116 are illustrated, depending on whether the injection frequency generating circuit 104 or the dynamically adjustable load circuit 106 are used or not. The upper signal shows the amplitude of the crystal oscillator signal using the dynamically adjustable load circuit 106 with a solid line and the crystal oscillator signal without using the dynamically adjustable load circuit 106 with a dashed line.

The lower signal shows the crystal oscillator signal when using the injection frequency generating circuit 104. It is clear that the signal strength at the pin 114 is higher when the injection frequency generating circuit 104 is enabled, and when it is disabled, the crystal oscillator signal may have received a boost in start-up time and may quickly achieve full swing.

The start-up period during which the injection frequency generating circuit 104 is enabled may typically last a few μs, such as 3-5 μs. An effect of using the injection frequency generating circuit 104 may be simulated in order to determine a suitable length of the start-up period. Additionally or alternatively, a suitable length of the start-up period may be determined by tests in manufacturing of the crystal oscillator circuit 100. The injection frequency control circuit 110 may be provided with information of the length of the start-up period in order to provide an enable signal EN_INJ which is high for a length of time corresponding to a stored length of the start-up period.

It should be noted that the sequence control for DAL and injection theoretically can be fully autonomous without requiring any external control sequence, thus hardware. This reduces overhead in power, area, and system complexity significantly compared to conventional approaches for crystal oscillator start-up.

Thus, the crystal oscillator circuit 100 may use dynamically adjustable load to increase $R_N$ at start-up, and internal harmonic harvesting and injection to further reduce the start-up time. A simulated performance shows that the start-up time of the crystal oscillator 102 can be reduced with a factor of more than 10. In addition, the injection frequency is stable against variations in supply voltage and temperature.

Figure 8:
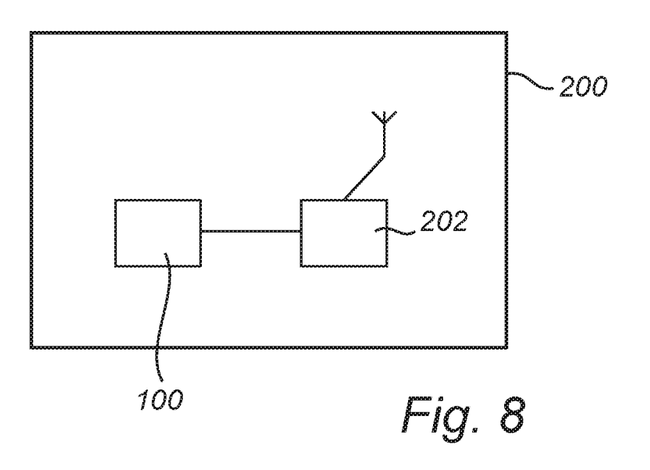
FIG. 8 is a schematic view of a wireless sensor node including the crystal oscillator circuit, according to an example embodiment.

Referring now to FIG. 8, the crystal oscillator circuit 100 providing fast start-up of a crystal oscillator 102 may be used in a wireless sensor node 200.

The wireless sensor node 200 may comprise a transceiver 202 for communicating on a wireless sensor network. The wireless sensor node 200 may be configured to be active for brief periods of time and be inactive between these periods. When active, the wireless sensor node 200 may transmit a data packet providing information on the wireless sensor network and, once the data packet has been transmitted, the wireless sensor node 200 may resume a sleep mode.

The crystal oscillator circuit 100 may be configured to provide a clock signal to the transceiver 202 for enabling the transceiver 202 to transmit a data packet.

Thus, power consumption of the wireless sensor node 200 may be highly dependent on the start-up time of the crystal oscillator 102, as the start-up time affects the length of the active periods of the wireless sensor node 200. Using the crystal oscillator circuit 100 as described above provides a very short start-up time of the crystal oscillator 102 and, hence, enables a low power consumption of the wireless sensor node 200.

Figure 9:
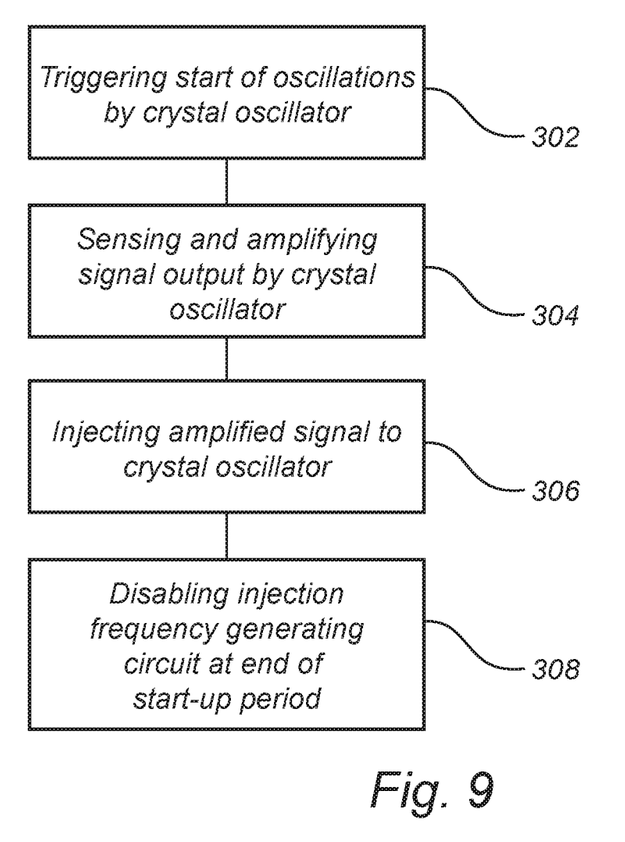
FIG. 9 is a flowchart of a method, according to an example embodiment.

Referring now to FIG. 9, a method for starting up a crystal oscillator 102 will be described.

The method comprises triggering 302 a start of oscillations by the crystal oscillator. A trigger signal may be the only external input necessary for the crystal oscillator 102 to be started.

The method further comprises sensing and amplifying 304 the signal output by the crystal oscillator 102 by an injection frequency generating circuit 104. By means of using the signal from the crystal oscillator 102, the amplified signal may have the same frequency as the frequency of the crystal oscillator 102.

The method further comprises injecting 306 the amplified signal to the crystal oscillator 102. The injected signal increases internal noise of the crystal oscillator 102 and hence boosts start-up of the crystal oscillator 102.

The method may further comprise disabling 308 the injection frequency generating circuit 104 at an end of a start-up period. Thus, the injection frequency generating circuit 104 is only used initially to boost start-up of the crystal oscillator 102 and may then be disabled in order to save power.

The method for starting up the crystal oscillator 102 may also make use of a tunable loading capacitance of the crystal oscillator circuit 100 such that a small loading capacitance may be provided during start-up and the loading capacitance may be increased when the signal from the crystal oscillator 102 is of sufficient quality.

In the above the inventive concept has mainly been described with reference to a limited number of examples. However, as is readily appreciated by a person skilled in the art, other examples than the ones disclosed above are equally possible within the scope of the inventive concept, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A crystal oscillator circuit comprising:
a crystal oscillator;
an injection frequency generating circuit, wherein the injection frequency generating circuit is configured, during start-up of the crystal oscillator, to sense a signal output by the crystal oscillator to form a sensed signal separate from the signal output by the crystal oscillator and amplify the sensed signal to form an amplified signal, and wherein the injection frequency generating circuit is further configured to inject the amplified signal to the crystal oscillator; and
an injection frequency control circuit for enabling the injection frequency generating circuit during an initial start-up period and disabling the injection frequency generating circuit at an end of the initial start-up period, wherein the injection frequency generating circuit comprises a two-stage operational amplifier circuit for sensing and amplifying the signal of the crystal oscillator, and the two-stage operational amplifier circuit has a gain bandwidth that is stable against external process, supply voltage, or temperature variations;
wherein the crystal oscillator circuit is configured such that the crystal oscillator (i) receives the amplified signal during the initial start-up period of the crystal oscillator and (ii) stops receiving any injected signals, including the amplified signal, at the end of the initial start-up period.

2. The crystal oscillator circuit according to claim 1, wherein the injection frequency generating circuit is connected to pins on opposite sides of the crystal oscillator for sensing the signal and for injecting the amplified signal.

3. The crystal oscillator circuit according to claim 1, wherein the injection frequency generating circuit is configured to vary a frequency of the amplified signal injected to the crystal oscillator based on an injection frequency window extending signal.

4. The crystal oscillator circuit according to claim 3, wherein the injection frequency window extending signal affects a parameter for varying latency of the two-stage operational amplifier circuit of the injection frequency generating circuit.

5. The crystal oscillator circuit according to claim 4, wherein the parameter is an input bias current of the injection frequency generating circuit, a dimension of transistors of operational amplifiers, or a load capacitance at an output of the two-stage operational amplifier circuit.

6. The crystal oscillator according to claim 3, wherein the injection frequency window extending signal affects a delay generator of the injection frequency generating circuit for varying latency of the delay generator.

7. A crystal oscillator circuit comprising:
a crystal oscillator; and
an injection frequency generating circuit, wherein the injection frequency generating circuit is configured, during start-up of the crystal oscillator, to sense a signal output by the crystal oscillator to form a sensed signal separate from the signal output by the crystal oscillator and amplify the sensed signal to form an amplified signal, and the injection frequency generating circuit is further configured to inject the amplified signal to the crystal oscillator, the injection frequency generating circuit is configured to vary a frequency of the amplified signal injected to the crystal oscillator based on an injection frequency window extending signal, the injection frequency window extending signal affects a delay generator of the injection frequency generating circuit for varying latency of the delay generator, and the delay generator is a digital-to-time converter (DTC) or digitally-controlled delay line (DCDL),
wherein the crystal oscillator circuit is configured such that the crystal oscillator (i) receives the amplified signal during an initial start-up period of the crystal oscillator and (ii) stops receiving any injected signals, including the amplified signal, at an end of the initial start-up period.

8. The crystal oscillator circuit according to claim 1, wherein a loading capacitance control circuit comprises at least one load capacitor bank, which is configured to provide a tunable capacitance, such that a small capacitance is provided during start-up of the crystal oscillator.

9. The crystal oscillator circuit according to claim 8, further comprising a clock detecting circuit, which is configured to receive a clock signal from the crystal oscillator and determine whether a quality of the clock signal is sufficient for output from the crystal oscillator circuit.

10. The crystal oscillator circuit according to claim 9, wherein the clock detecting circuit is configured to output a ready signal to the loading capacitance control circuit when it is determined that a quality of the clock signal is sufficient for output from the crystal oscillator circuit, wherein the output of the ready signal triggers increasing a capacitance of the at least one load capacitor bank of the crystal oscillator circuit.

11. The crystal oscillator circuit according to claim 10, wherein the loading capacitance control circuit and an injection frequency control circuit are combined in a single circuit for controlling both the loading capacitance and the injection frequency.

12. The crystal oscillator circuit according to claim 9, wherein the clock detecting circuit comprises an envelope detector configured to determine a signal strength of the signal from the crystal oscillator.

13. The crystal oscillator circuit according to claim 12, wherein the clock detecting circuit comprises a comparator configured to receive an envelope signal from the envelope detector, and configured to determine whether an amplitude of the signal from the crystal oscillator exceeds a threshold level.

14. A wireless sensor node comprising the crystal oscillator circuit according to claim 1, wherein the crystal oscillator circuit provides a reference clock signal or a real-time counter.

15. A method for starting up a crystal oscillator, the method comprising:
    triggering start of oscillations by the crystal oscillator such that a signal is output by the crystal oscillator;
    during start-up of the crystal oscillator, sensing and amplifying the signal output by the crystal oscillator by a two-stage operational amplifier circuit of an injection frequency generating circuit to form an amplified signal separate from the signal output by the crystal oscillator, wherein the two-stage operational amplifier circuit has a gain bandwidth that is stable against external process, supply voltage, or temperature variations;
    enabling, by an injection frequency control circuit and during an initial start-up period of the crystal oscillator, the injection frequency generating circuit to thereby cause the injection frequency generating circuit to inject the amplified signal to the crystal oscillator to increase internal noise in the crystal oscillator and thereby decrease start-up time of the crystal oscillator; and
    disabling, by the injection frequency control circuit, the injection frequency generating circuit at an end of the initial start-up period of the crystal oscillator, such that the crystal oscillator stops receiving any injected signals, including the amplified signal.

16. The method according to claim 15, further comprising increasing a loading capacitance of a crystal oscillator circuit in response to detecting that a quality of a clock signal is sufficient for output from the crystal oscillator circuit.

17. The method according to claim 15, further comprising varying a frequency of the amplified signal injected to the crystal oscillator.

* * * * *